(12) United States Patent
Quiquempoix et al.

(10) Patent No.: US 10,197,605 B2
(45) Date of Patent: Feb. 5, 2019

(54) SYSTEM AND METHOD FOR RIPPLE-FREE AC POWER DETERMINATION

(71) Applicant: Microchip Technology Incorporated, Chandler, AZ (US)

(72) Inventors: Vincent Quiquempoix, Divonne les bains (FR); Michael Brumann, Bienne (CH)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 618 days.

(21) Appl. No.: 14/669,232

(22) Filed: Mar. 26, 2015

(65) Prior Publication Data

US 2016/0282391 A1 Sep. 29, 2016

(51) Int. Cl.
*G01R 21/00* (2006.01)
*G01R 21/06* (2006.01)
(Continued)

(52) U.S. Cl.
CPC ............ *G01R 21/003* (2013.01); *G01R 21/06* (2013.01); *G01R 21/1331* (2013.01);
(Continued)

(58) Field of Classification Search
CPC .. G01R 21/002; G01R 21/003; G01R 21/005; G01R 21/06; G01R 21/006;
(Continued)

(56) References Cited

U.S. PATENT DOCUMENTS 3,886,449 A * 5/1975 Wolfinger ............... G01R 21/00
324/142
4,399,395 A * 8/1983 Espelage ............. H02M 5/4505
318/803
(Continued)

FOREIGN PATENT DOCUMENTS

CN 1439883 A * 9/2003
CN 1439883 A * 9/2003

OTHER PUBLICATIONS

Blasko, Vladimir, "Adaptive Filtering for Selective Elimination of Higher Harmonics from Line Currents of a Voltage Source Converter," Industry Applications Conference, $33^{rd}$ IAS Annual Meeting, IEEE, pp. 1222-1228 (7 pages), Oct. 12, 1998.
(Continued)

*Primary Examiner* — Jermele M Hollington
*Assistant Examiner* — Sean Curtis
(74) *Attorney, Agent, or Firm* — Slayden Grubert Beard PLLC

(57) ABSTRACT

A power metering circuit includes a current input path for receiving an analog current input at a first analog to digital converter; a voltage input path for receiving an analog voltage input at a second analog to digital converter; a multiplier configured to multiply an output of the current input path and the voltage input path; a notch filter configured to receive an output of the multiplier, the notch filter having a stop band based on a line frequency; and a control circuit for setting a sampling frequency of the first analog to
(Continued)

digital converter and the second analog to digital converter to a multiple of the line frequency.

18 Claims, 2 Drawing Sheets

(51) Int. Cl.
    *G01R 21/133*     (2006.01)
    *G01R 23/165*     (2006.01)
    *H03L 7/099*     (2006.01)
    *H03M 1/12*     (2006.01)
    *H03M 1/36*     (2006.01)

(52) U.S. Cl.
    CPC ............ *G01R 23/165* (2013.01); *H03L 7/099* (2013.01); *H03M 1/1245* (2013.01); *H03M 1/36* (2013.01)

(58) Field of Classification Search
    CPC   G01R 21/1331; G01R 23/165; G01R 23/167; H03L 7/099
    USPC .............. 324/76.45, 140 R–142; 363/40–42; 307/66; 702/60–61, 75; 341/126, 143, 341/145; 708/300
    See application file for complete search history.

(56) References Cited

U.S. PATENT DOCUMENTS

| | | | | |
|---|---|---|---|---|
| 4,490,688 A * | 12/1984 | Borras | ............... | H03C 3/0933 327/8 |
| 4,931,725 A * | 6/1990 | Hutt | ............... | G01R 21/133 324/130 |
| 5,349,352 A * | 9/1994 | Saleh | ............... | H03M 1/0624 341/143 |
| 5,459,432 A * | 10/1995 | White | ............... | G01C 19/5607 329/307 |
| 5,854,995 A * | 12/1998 | Plis | ............... | G01R 21/1331 702/72 |
| 5,978,741 A * | 11/1999 | Elmore | ............... | G01R 21/1331 702/60 |
| 6,173,236 B1 * | 1/2001 | Elmore | ............... | G01R 21/1331 324/86 |
| 6,329,905 B1 * | 12/2001 | Cunningham | ........... | H04B 3/54 340/855.3 |
| 6,417,792 B1 * | 7/2002 | King | ............... | G01R 21/133 341/143 |
| 6,876,178 B2 * | 4/2005 | Wu | ............... | G05F 1/70 323/205 |
| 6,943,714 B2 * | 9/2005 | White | ............... | G01R 21/133 341/118 |
| 6,977,827 B2 * | 12/2005 | Gritter | ............... | H02M 1/12 323/207 |
| 7,015,597 B2 * | 3/2006 | Colby | ............... | H02J 3/1835 307/31 |
| 7,102,556 B2 * | 9/2006 | White | ............... | G01R 21/133 341/118 |
| 7,425,874 B2 * | 9/2008 | Risbo | ............... | H03L 7/0995 331/1 A |
| 7,778,053 B2 * | 8/2010 | Gritter | ............... | H02M 7/53873 307/105 |
| 7,962,298 B2 * | 6/2011 | Przydatek | ............ | G01R 22/065 702/61 |
| 8,010,304 B2 * | 8/2011 | Lu | ............... | G01R 19/2513 324/76.44 |
| 8,073,075 B2 * | 12/2011 | Matsuoka | ............ | H03F 1/0211 348/723 |
| 8,165,835 B1 * | 4/2012 | Singh | ............... | G01R 21/1331 324/141 |
| 9,201,104 B2 * | 12/2015 | Jackson | ............... | G01R 21/133 |
| 9,568,507 B2 * | 2/2017 | Perry | ............... | G01R 21/133 |
| 2004/0032357 A1 * | 2/2004 | White | ............... | G01R 21/133 341/155 |
| 2004/0098699 A1 * | 5/2004 | Breejen | ............... | H03K 19/1732 326/38 |
| 2005/0207190 A1 * | 9/2005 | Gritter | ............... | H02M 1/12 363/40 |
| 2005/0273482 A1 * | 12/2005 | Moore | ............... | H03H 17/025 708/300 |
| 2006/0062291 A1 * | 3/2006 | Marotta | ............ | H03H 17/0248 375/238 |
| 2007/0067121 A1 * | 3/2007 | Przydatek | ............... | G01R 22/06 702/57 |
| 2007/0109823 A1 * | 5/2007 | Rastogi | ............... | H02J 3/1857 363/40 |
| 2007/0189045 A1 * | 8/2007 | Gritter | ............... | H02M 1/14 363/40 |
| 2007/0279041 A1 * | 12/2007 | Fritz | ............... | G01R 21/133 324/142 |
| 2007/0279042 A1 * | 12/2007 | Tan | ............... | G01R 15/181 324/142 |
| 2008/0037297 A1 * | 2/2008 | Torre | ............... | H02M 3/33515 363/41 |
| 2008/0219035 A1 * | 9/2008 | Wu | ............... | H02J 3/1842 363/41 |
| 2010/0088049 A1 * | 4/2010 | Lu | ............... | G01R 19/2513 702/60 |
| 2012/0278020 A1 * | 11/2012 | Antonesei | .......... | G01R 19/2513 702/75 |
| 2014/0009982 A1 * | 1/2014 | Li | ............... | H02M 1/14 363/40 |
| 2014/0028282 A1 * | 1/2014 | Perry | ............... | G01R 21/133 324/76.11 |
| 2014/0097691 A1 * | 4/2014 | Jackson | ............... | G01R 21/133 307/66 |
| 2016/0282391 A1 * | 9/2016 | Quiquempoix | ...... | G01R 21/003 |

OTHER PUBLICATIONS

International Search Report and Written Opinion, Application No. PCT/US2016/023561, 15 pages, dated Jun. 17, 2016.

\* cited by examiner

SYSTEM AND METHOD FOR RIPPLE-FREE AC POWER DETERMINATION

TECHNICAL FIELD

The present disclosure relates to power metering and, in particular, to systems and methods for determining active and reactive power.

BACKGROUND

In a simple alternating current (AC) circuit, if the circuit is purely resistive, the current and voltage are in-phase, and true or active power is given by P=VI, in watts. If the loads are purely reactive, i.e., inductive or capacitive, then the voltage and current are ninety (90) degrees out of phase, and reactive power is given in Volt-Amperes-Reactive. In this case, there is no net transfer of energy to the load.

Practical loads have resistance, inductance, and capacitance, so both true and reactive power will flow to real loads. Even though the current associated with reactive power does no work at the load, it heats the wires, wasting energy.

In power metering applications, the most common way to measure active and reactive power is to convert current and voltage to digital words or streams with an analog to digital converter (ADC) and then apply a variety of processing to derive active and reactive power. For AC power, the current and voltage both have a fundamental frequency component at the line frequency $\omega$. When doing the instantaneous power calculation, a multiplication is necessary between voltage and current channels. The result of the multiplication contains energy in DC (which is either active or reactive power depending on what quantities have been multiplied) and energy in the $2\omega$ component, where $\omega$ is the line frequency. Usually, this result is low pass filtered (LPF) to extract only the DC information but unless a large filter is applied, the remainder of the $2\omega$ is still large enough to create large jitters if a PWM (pulse width modulator) output is connected after the LPF.

Shown in FIG. 1 is an example conventional power meter calculation block for AC active or reactive power. The block 100 includes a pair of analog-to-digital converters 102a, 102b, for digitizing current I and voltage V, respectively. The outputs of the ADCs 102a, 102b are filtered by highpass filters (HPF) 104a, 104b, respectively, to remove offset components. Then the current I is multiplied at multiplier 110 with the voltage (switch 108 being closed) to obtain the instantaneous active power or (switch 108 being open), the voltage is applied to phase shifter 106 and then multiplied with the current to obtain the instantaneous reactive power.

The instantaneous powers include a DC component and a $2\omega$) component due to the multiplication. The instantaneous powers are then lowpass filtered using one or more LPFs 112, 114 to extract the desired quantity. Typically, the filtering is implemented as a simple IIR (infinite impulse response) first order LPF. As noted above, however, if a PWM 116 is applied at the output of the filtering, then jitter can still result from the $2\omega$) component.

Accordingly, there is a need for an improved and more stable output for power metering.

SUMMARY

According to various embodiments, the $2\omega$) component may be canceled using the systems and methods disclosed herein. A power metering circuit in accordance with embodiments includes a current input path for receiving an analog current input at a first analog to digital converter; a voltage input path for receiving an analog voltage input at a second analog to digital converter; a multiplier configured to multiply an output of the current input path and the voltage input path; a notch filter configured to receive an output of the multiplier, the notch filter having a stop band based on a line frequency; and a control circuit for setting a sampling frequency of the first analog to digital converter and the second analog to digital converter to a multiple of the line frequency.

In some embodiments, the control circuit includes a phase locked loop configured to receive one of the analog current input and the analog voltage input. In some embodiments, the control circuit comprises a frequency detector and a programmable oscillator configured to receive an output of the frequency detector. In some embodiments, the current input path and the voltage input path each including a highpass filter. In some embodiments, the voltage input path includes a selectable phase shifter. In some embodiments, the circuit further includes an output pulse width modulator.

A power metering circuit in accordance with embodiments includes a first input path for receiving one of an analog current input or an analog voltage input at a first analog to digital converter; a second input path for receiving another of the analog voltage input or the analog current input at a second analog to digital converter; a multiplier configured to multiply an output of the first input path and the second input path; and a notch filter configured to receive an output of the multiplier, the notch filter having a stop band based on a line frequency.

In some embodiments, the circuit includes a control circuit for setting a sampling frequency of the first analog to digital converter and the second analog to digital converter to a multiple of the line frequency. In some embodiments, the control circuit includes a phase locked loop configured to receive one of the analog current input and the analog voltage input. In some embodiments, the control circuit comprises a frequency detector and a programmable oscillator configured to receive an output of the frequency detector. In some embodiments, the first input path and the second input path each including a highpass filter. In some embodiments, the first input path includes a selectable phase shifter. In some embodiments, the circuit includes an output pulse width modulator.

A method in accordance with embodiments includes receiving an analog current input at a first analog to digital converter; receiving an analog voltage input at a second analog to digital converter; multiplying an output of the current input path and the voltage input path; notch filtering an output of the multiplier with a stop band based on a line frequency; and setting a sampling frequency of the first analog to digital converter and the second analog to digital converter to a multiple of the line frequency.

In some embodiments, setting the sampling frequency includes using a phase locked loop configured to receive one of the analog current input and the analog voltage input. In some embodiments, setting the sampling frequency comprises using a frequency detector and a programmable oscillator configured to receive an output of the frequency detector. In some embodiments, the current input path and the voltage input path each including a highpass filter. In some embodiments, the voltage input path includes a selectable phase shifter.

These, and other aspects of the disclosure will be better appreciated and understood when considered in conjunction with the following description and the accompanying drawings. It should be understood, however, that the following description, while indicating various embodiments of the disclosure and numerous specific details thereof, is given by way of illustration and not of limitation. Many substitutions, modifications, additions and/or rearrangements may be made within the scope of the disclosure without departing from the spirit thereof, and the disclosure includes all such substitutions, modifications, additions and/or rearrangements.

BRIEF DESCRIPTION OF THE DRAWINGS

The drawings accompanying and forming part of this specification are included to depict certain aspects of the disclosure. It should be noted that the features illustrated in the drawings are not necessarily drawn to scale. A more complete understanding of the disclosure and the advantages thereof may be acquired by referring to the following description, taken in conjunction with the accompanying drawings in which like reference numbers indicate like features and wherein.

DETAILED DESCRIPTION

The disclosure and various features and advantageous details thereof are explained more fully with reference to the exemplary, and therefore non-limiting, embodiments illustrated in the accompanying drawings and detailed in the following description. It should be understood, however, that the detailed description and the specific examples, while indicating the preferred embodiments, are given by way of illustration only and not by way of limitation. Descriptions of known programming techniques, computer software, hardware, operating platforms and protocols may be omitted so as not to unnecessarily obscure the disclosure in detail. Various substitutions, modifications, additions and/or rearrangements within the spirit and/or scope of the underlying inventive concept will become apparent to those skilled in the art from this disclosure.

As will be discussed in greater detail below, embodiments provide an improved ripple-free calculation block for determining active or reactive power, removing the $2\omega$ component. In particular, embodiments use a notch filter to remove the $2\omega$ component. If the notch filter has a notch at $2\omega$, the component is removed and after the filter, the output contains only the desired DC quantity.

A difficulty can arise, however, because the $2\omega$ frequency must be known in order to place a notch at the $2\omega$ frequency. Typically, however, the line frequency is not known and can move and change with time, temperature and network inaccuracies.

Accordingly, embodiments are provided that include a control circuit which can track the line frequency and provide the notch at the correct $2\omega$ frequency. One such embodiment employs a phase-locked loop (PLL) and is shown, for example, in FIG. 2.

Figure 1:
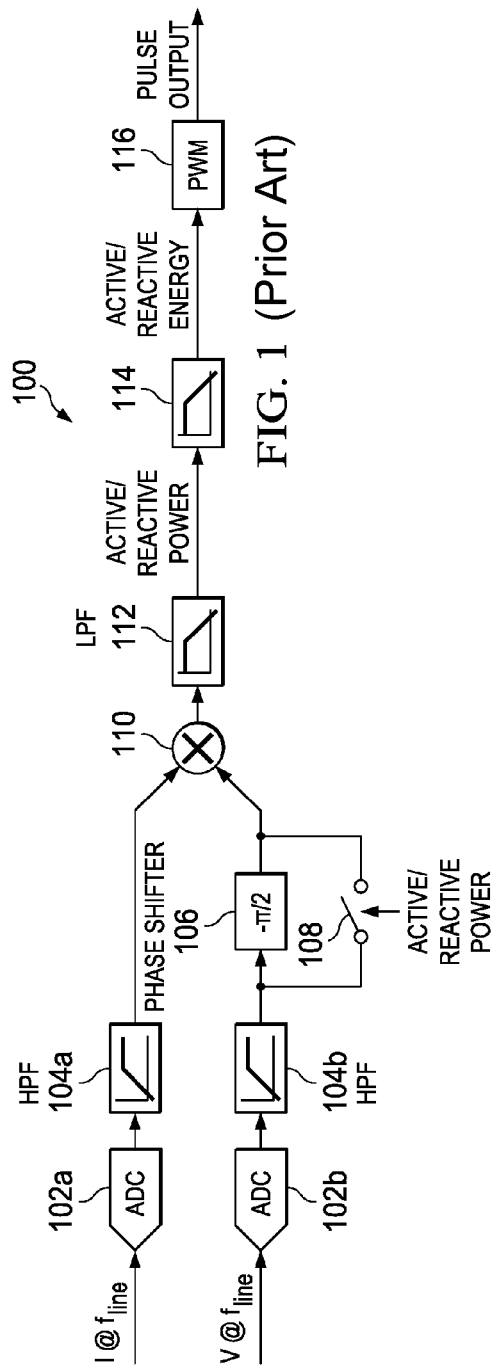
FIG. 1 is a diagram illustrating an exemplary system according to the prior art.
Figure 2:
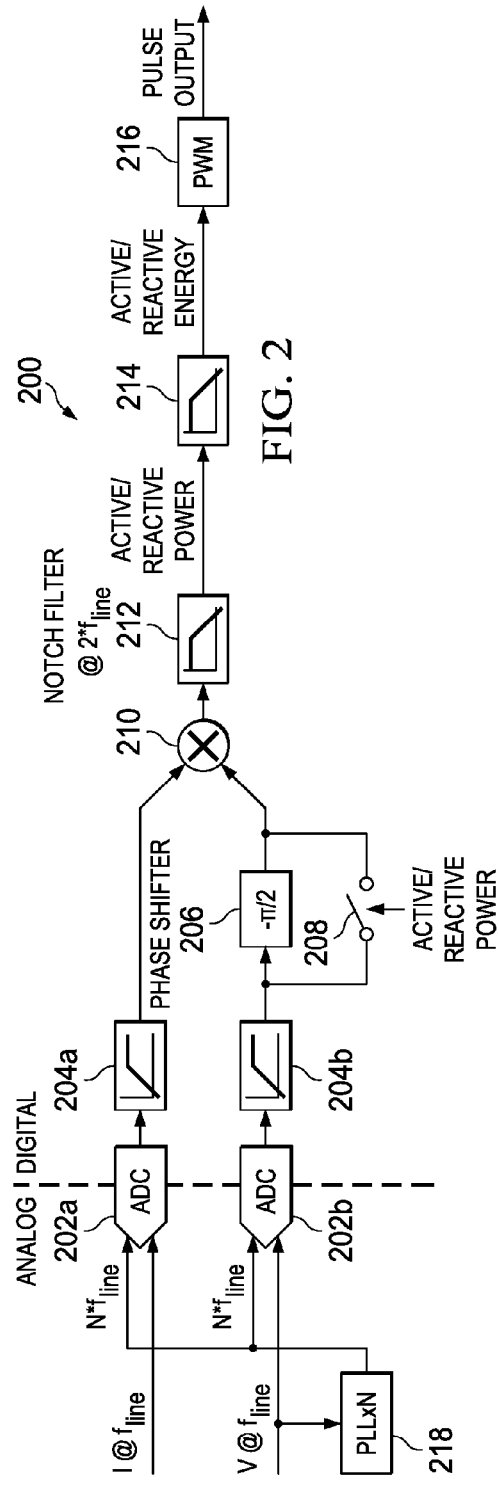
FIG. 2 is a diagram illustrating an exemplary system in accordance with embodiments.

The block 200 of FIG. 2 includes a pair of analog-to-digital converters 202a, 202b, for digitizing current I and voltage V, respectively. The outputs of the ADCs 202a, 202b are filtered by highpass filters 204a, 204b, respectively, to remove offset components. Then the current I is multiplied at multiplier 210 with the voltage (switch 208 being closed) to obtain the instantaneous active power or (switch 208 being open), the voltage is applied to phase shifter 206 and then multiplied with the current to obtain the instantaneous reactive power.

The instantaneous powers include a DC component and a $2\omega$) component due to the multiplication. The $2\omega$) component is filtered using a notch filter 212 in accordance with embodiments. Active or reactive power signal is then filtered at 214 and provided to PWM 216 from which a pulse output is provided.

In addition, a phase locked loop 218 is provided to receive and lock the line frequency. As shown, the PLL 218 outputs $Nf_{line}$, which is used by the ADC as the sampling frequency. Thus, the data rate of the ADC is a multiple of the line frequency. If the converter is an oversampling converter, then oversampling rate is $Nf_{line}OSR$, OSR being the oversampling ratio. In this case, all calculations are performed at the data rate frequency $Nf_{line}$. The notch filter 212 may be implemented as a first or second order sinc filter. In such a case, if the data rate of the ADC is $Nf_{line}$, an oversampling rate or averaging factor of N/2 can be used to get a notch at precisely the 2fline frequency.

The N factor depends on the desired bandwidth of the converter. For example, if the application requires convert 32 harmonics of the line frequency, N >64. Since the PLL has to multiply OSR×N, where OSR is typically between 32 and 512, and N is usually between 8 and 64, the PLL might be a relatively complex analog component.

Figure 3:
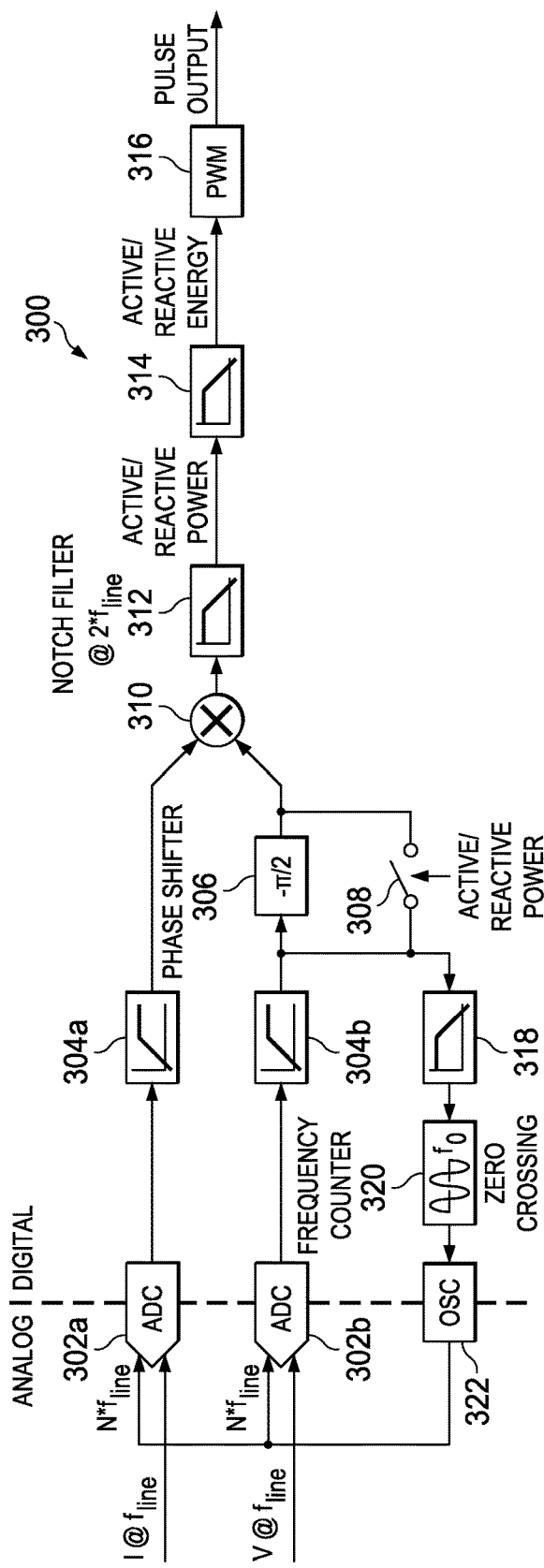
FIG. 3 is a diagram illustrating an exemplary system in accordance with embodiments.

Consequently, other embodiments may use a programmable master clock oscillator and digital processing blocks as the control circuit. Such an embodiment is illustrated in FIG. 3. The block 300 of FIG. 3 includes a pair of analog-to-digital converters 302a, 302b, for digitizing current I and voltage V, respectively. The outputs of the ADCs 302a, 302b are filtered by highpass filters 304a, 304b, respectively, to remove offset components. Then the current I is multiplied at multiplier 310 with the voltage (switch 308 being closed) to obtain the instantaneous active power or (switch 308 being open), the voltage is applied to phase shifter 306 and then multiplied with the current to obtain the instantaneous reactive power.

The instantaneous powers include a DC component and a $2\omega$ component due to the multiplication. The $2\omega$ component is filtered using a notch filter 312 in accordance with embodiments. Active or reactive power signal is then filtered at 314 and provided to PWM 316 from which a pulse output is provided.

In addition, a control circuit including lowpass filter 318, frequency counter 320, and oscillator 322 is provided. In this embodiment, the line frequency is measured by LPF 318 (e.g., 1st or second order IIR) to avoid the noise and harmonics to disturb the measurement, followed by a zero-crossing detector and frequency counter 320. The line period is then extracted with a number of clock cycles of the frequency detector 320. The frequency of the oscillator 322 is then programmed and adjusted as a function of this line frequency detection to be as close as possible to an integer multiple of the line frequency calculated through the zero crossing path.

In one embodiment, employing a relatively simple notch filter (sinc with an N/2 averaging rate being a power of 2), the number of clock periods detected should be a power of 2 when the oscillator 322 is tuned so that the data rate can be a power of 2 multiple of the $f_{line}$. In such a case the digital processing needed to implement the notch filter is relatively small (a first order sine filter can be implemented with a simple adder) while the frequency evaluation block size remains in most cases substantially smaller than the PLL of the first case.

With both cases of the PLL and frequency evaluation and tuning of the oscillator, the output result after the notch filter is a DC-only component. The other advantage the notch filter induces is that it cancels also all the 2ω components from all the harmonics of the power line. Therefore the output signal is clean of any harmonics, as long as the frequency tracker (PLL, or programmable oscillator with digital processing) tracks correctly the $f_{line}$ frequency.

What is claimed is:

1. A power metering circuit, comprising: a current input path for receiving an analog current input at a first analog to digital converter; a voltage input path for receiving an analog voltage input at a second analog to digital converter; a multiplier configured to multiply an output of the current input path and the voltage input path; a notch filter configured to receive an output of the multiplier, the notch filter having a stop band based on a line frequency; and a control circuit for setting a sampling frequency of the first analog to digital converter and the second analog to digital converter to a multiple of the line frequency, wherein the control circuit comprises a frequency detector and a programmable oscillator configured to receive an output of the frequency detector and to generate said sampling frequency, and wherein the frequency detector comprises a low pass filter followed by a zero-crossing detector and frequency counter.

2. A power metering circuit in accordance with claim 1, wherein a number of clock periods detected is a power of 2 multiple of the line frequency.

3. A power metering circuit in accordance with claim 1, the current input path and the voltage input path each including a highpass filter.

4. A power metering circuit in accordance with claim 3, wherein the voltage input path includes a selectable phase shifter.

5. A power metering circuit in accordance with claim 1, including an output pulse width modulator.

6. A power metering circuit, comprising: a first input path for receiving one of an analog current input or an analog voltage input at a first analog to digital converter; a second input path for receiving another of the analog voltage input or the analog current input at a second analog to digital converter; a multiplier configured to multiply an output of the first input path and the second input path; and a notch filter configured to receive an output of the multiplier, the notch filter having a stop band based on a line frequency, and a control circuit for setting a sampling frequency of the first analog to digital converter and the second analog to digital converter to a power of 2 multiple of the line frequency.

7. A power metering in accordance with claim 6, wherein the control circuit includes a phase locked loop configured to receive one of the analog current input and the analog voltage input and to generate said sampling frequency.

8. A power metering circuit in accordance with claim 6, wherein the control circuit comprises a frequency detector and a programmable oscillator configured to receive an output of the frequency detector and to generate said sampling frequency.

9. A power metering circuit in accordance with claim 6, the first input path and the second input path each including a high pass filter.

10. A power metering circuit in accordance with claim 9, wherein the first input path includes a selectable phase shifter.

11. A power metering circuit in accordance with claim 6, including an output pulse width modulator.

12. A method, comprising: receiving an analog current input at a first analog to digital converter; receiving an analog voltage input at a second analog to digital converter; multiplying an output of the current input path and the voltage input path; notch filtering an output of the multiplier with a stop band based on a line frequency; and setting a sampling frequency of the first analog to digital converter and the second analog to digital converter to a power of 2 multiple of the line frequency.

13. A method in accordance with claim 12, wherein setting the sampling frequency includes using a phase locked loop configured to receive one of the analog current input and the analog voltage input.

14. A method in accordance with claim 13, wherein setting the sampling frequency comprises using a frequency detector and a programmable oscillator configured to receive an output of the frequency detector.

15. A method in accordance with claim 12, the current input path and the voltage input path each including a highpass filter.

16. A method in accordance with claim 15, wherein the voltage input path includes a selectable phase shifter.

17. A method in accordance with claim 12, further comprising detecting the line frequency with a detector frequency detector comprising a low pass filter followed by a zero-crossing detector and frequency counter.

18. A power metering circuit in accordance with claim 6, further comprising a detector frequency detector comprising a low pass filter followed by a zero-crossing detector and frequency counter.

* * * * *